United States Patent
Kuechler et al.

(10) Patent No.: US 6,968,163 B2
(45) Date of Patent: Nov. 22, 2005

(54) METHOD AND TRANSMISSION CIRCUIT FOR GENERATING A TRANSMISSION SIGNAL

(75) Inventors: Heinz Kuechler, Munich (DE); Thomas Moliere, Munich (DE); Jose Sevilla Garcia, Murcia (ES); Hartmut Wilhelm, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 434 days.

(21) Appl. No.: 10/220,680

(22) PCT Filed: Mar. 2, 2001

(86) PCT No.: PCT/DE01/00786

§ 371 (c)(1),
(2), (4) Date: Sep. 3, 2002

(87) PCT Pub. No.: WO01/65683

PCT Pub. Date: Sep. 7, 2001

(65) Prior Publication Data

US 2003/0032397 A1 Feb. 13, 2003

(30) Foreign Application Priority Data

Mar. 3, 2000 (DE) .......................................... 100 10 635

(51) Int. Cl.⁷ ............................. H04B 1/04; H04B 1/02; H03C 1/52; H03F 1/36
(52) U.S. Cl. .................... 455/126; 455/127.2; 455/108; 455/114.3; 455/115.1; 330/96; 330/149
(58) Field of Search ................... 455/126, 127.1–127.4, 455/102, 108, 110, 114.2, 114.3, 115.1, 115.3; 330/127, 129–136, 10, 149, 75, 96

(56) References Cited

U.S. PATENT DOCUMENTS

| | | | | |
|---|---|---|---|---|
| 3,900,823 A | * | 8/1975 | Sokal et al. | 330/149 |
| 4,709,403 A | * | 11/1987 | Kikuchi | 455/126 |
| 5,214,393 A | * | 5/1993 | Aihara | 330/279 |
| 5,287,555 A | * | 2/1994 | Wilson et al. | 455/115.1 |
| 5,369,789 A | * | 11/1994 | Kosugi et al. | 455/126 |
| 5,376,895 A | * | 12/1994 | Aihara | 330/129 |
| 5,675,288 A | * | 10/1997 | Peyrotte et al. | 330/149 |
| 6,295,442 B1 | * | 9/2001 | Camp et al. | 455/102 |

FOREIGN PATENT DOCUMENTS

| | | | |
|---|---|---|---|
| DE | 44 29 535 | 2/1996 | H03G/3/20 |
| EP | 0 558 793 | 9/1993 | H03F/1/30 |
| FR | 2 532 491 | 2/1984 | H03F/1/32 |
| WO | WO 86/00476 | 1/1986 | H03C/1/06 |

* cited by examiner

Primary Examiner—Duc M. Nguyen
(74) Attorney, Agent, or Firm—Bell Boyd & Lloyd LLC (57) ABSTRACT

A method and transmission circuit are provided for generating a transmission signal, wherein the feedback component of the transmission signal is attenuated in accordance with the required mean transmission power and used for regulation, i.e., the mean transmission power is adjusted by variable attenuation between the transmission amplifier and the comparator in the control loop.

43 Claims, 3 Drawing Sheets

METHOD AND TRANSMISSION CIRCUIT FOR GENERATING A TRANSMISSION SIGNAL

BACKGROUND OF THE INVENTION

The present invention relates to a method for generating an amplitude-modulated transmission signal with an adjustable mean transmission power, in which an amplitude modulation signal is applied to an input of a transmission amplifier and in which the amplitude modulation signal is regulated by using a feedback component of the transmission signal. In addition, the present invention relates to a corresponding circuit and to a communication terminal including such a circuit.

In most transmitters, it is required that the transmission power can be adapted to the required range and possibly to the radio conditions in the respective environment of the transmitter and receiver, respectively. In the mobile radio standard GSM, the so-called power control level serves this purpose. This is used for adjusting the mean transmission power of the signal to be sent out, the "transmission power level". To avoid adjacent-channel interference caused by burst-mode operation, furthermore, the transmission power is slowly raised from zero to the target value at the beginning of the burst and is slowly reduced at the end of the burst. This so-called "power ramping" and the power control level are examples of the expressions mean transmission power, transmission power level or transmission output stage used in the text which follows. These expressions are not restricted to a graduated adjustment but continuous adjustment of the power value is also possible. Similarly, the present invention described hereinafter is not restricted to mobile radio applications.

In an amplitude-modulated signal, the instantaneous transmission power present at a particular point in time depends on the current amplitude of the signal. As a rule, the information to be transmitted is converted into amplitude modulation in such a manner that for certain information chains in a control system, digital samples are determined for the amplitude and these digital samples are then used for generating an analog amplitude modulation signal. The samples for the most varied chains of information (e.g., transmit data) are in each case stored, for example, in a table in a ROM memory. For reasons of saving memory space, only the samples for a precisely defined mean transmission power are stored. Depending on the mean transmission power required, therefore, the samples for the required mean power are calculated from these samples via suitable scaling. Therefore, the samples thus calculated or scaled, respectively, are used for generating the amplitude modulation.

The amplitude modulation signal is usually regulated by using a feedback component of the transmission signal in order to obtain a stable pure amplitude modulation signal. The regulation receives the samples, or values derived therefrom, as nominal values. The nominal values are compared with the part of the transmission signal, tapped off the output of the transmission amplifier, which represents the current actual value, and the transmission amplifier, also-called output stage in the text which follows, is correspondingly corrected. The dynamic range of the nominal signal is composed of the dynamic range of the amplitude modulation itself and the range of the possible adjustable transmission power. In the EDGE standard, the dynamic range of the amplitude modulation is 17 dB and the transmission power can be adjusted over a range of 27 dB. The overall dynamic range is, therefore, 44 dB. The same dynamic range also occurs in the actual signal. The feedback or control loop, respectively, must be able to handle this dynamic range. The requirement for the dynamic range can be even greater in other transmission methods; e.g. in the CDMA standard.

Such a wide dynamic range requires an elaborate circuit for linearizing the characteristics of the components needed in the control loop. In addition, a very efficient limiter circuit is needed for a possibly additional phase control loop in order to feed back the transmission signal for regulating the phase-modulated signal component when generating a phase-modulated and amplitude-modulated transmission signal.

WO 86 00476 A discloses a method and a device for generating an amplitude-modulated transmission signal with an adjustable mean transmission power, in which an amplitude modulation signal is applied to one input of a transmission amplifier and in which the amplitude modulation signal is regulated by utilizing a feedback component of the transmission signal, the component of the transmission signal fed back being utilized for the regulation attenuated in accordance with the required mean transmission power.

It is an object of the present invention to specify a method and a circuit for always retaining the stability while reducing the requirement for the dynamic range and for enabling simple and inexpensive components to be used.

SUMMARY OF THE INVENTION

According to the present invention, the feedback component of the transmission signal is attenuated in accordance with the required mean transmission power and used for the regulation; i.e., the mean transmission power is adjusted by variable attenuation between the transmission amplifier and the comparator in the control loop. Variable attenuation in the sense of this invention not only includes variable attenuation of the signal but also expressly includes a variable gain. If the transmission amplifier has a gain of <1, that is to say attenuates the signal, it is even necessary to amplify the transmission signal in the feedback branch depending on the power needed for determining the amplitude in the feedback branch.

Due to the attenuation in accordance with the required mean transmission power, the mean power in the feedback signal remains constant. That is to say, with a high transmission power, the feedback signal is strongly attenuated, and with a low transmission power, the signal may even be passed unattenuated, and the feedback component only retains the modulation-related amplitude change with a constant mean power. The current amplitude of this is then measured and compared with the nominal value.

If a higher mean transmission power is required, a suitable control arrangement adjusts a higher level of attenuation. Since this changes the difference between actual and nominal value, the amplitude modulation signal going to the transmission amplifier is automatically increased in the control loop until the difference signal is zero again; i.e., a higher transmission power is automatically output. Conversely, if a lower transmission power level is to be set, the attenuation in the feedback component of the transmission signal is reduced and the resultant actual amplitude at the comparator is too high until the control loop has lowered the transmission power level.

The attenuation can be adjusted in the most varied ways. One possibility consists in using a variable attenuator. Such variable attenuation can be achieved, for example, by a controllable voltage divider or by variable output coupling attenuation; i.e., an output coupling element with adjustable attenuation.

As an alternative, a combination of attenuating and amplifying components also can be used, at least one component of which must be adjustable. This is because variable amplification which is combined with fixed or variable attenuation preceding and/or following the amplification has the same effect as a variable attenuator. Before the amplification, suitable fixed attenuation also can be achieved, for example, by using an output coupling element having such fixed attenuation. As a rule, the output coupling of the feedback component of the transmission signal is associated with relatively strong attenuation, in any case, so that amplification is frequently required in the feedback branch. In consequence, either a variable amplifier can be used in this case or fixed amplification with a variable attenuator is used.

In a particularly preferred exemplary embodiment, the attenuator or the adjustable component or output coupling element is constructed in such a manner that they have a number of discrete adjustment steps. That is to say, the attenuation is adjusted step by step. A step-adjustable attenuator is a relatively simple component which can be manufactured with great accuracy. Precise step-adjustable amplifiers are also commercially available.

If scaling the samples for the amplitude is simpler than attenuating the feedback signal in very fine steps, a combination of both methods also can be used. Attenuation is then performed in a few coarse steps in accordance with the present invention and, in conjunction with this, the samples for the amplitude are scaled into a smaller range for the fine adjustment. This also considerably limits the dynamic range in the feedback branch but provides for very fine adjustment in a fairly simple way.

In a further advantageous exemplary embodiment, the attenuation is also not simply controlled but regulated. For this purpose, a special small control loop can be used in which, for example, a comparison of the mean power before and after the respective attenuating part/amplifier is simply performed. An additional amplitude measurement or a power measurement before the attenuating part/amplifiers is sufficient in this case. This measurement can be carried out with a relatively low cut-off frequency.

For coupling power out of the transmission signal, a coupling element arranged between the transmission amplifier unit and the antenna is preferably used. In particular, it is advantageous to use here a coupling element which mainly detects the wave passing toward the antenna and suppresses the wave reflected by the antenna; i.e., a so-called directional coupler.

If the component of the power which flows into the feedback cannot be neglected, especially if the magnitude of the attenuation due to the output coupling significantly influences the proportion of power remaining for the antenna, this circumstance preferably should be taken into consideration when designing the magnitude of the attenuation steps.

In a further preferred exemplary embodiment, the feedback signal, attenuated in accordance with the mean transmission power, is supplied to a controllable amplifier which regulates the amplitude of the feedback signal to a fixed value which can be predetermined by a reference value, in a further control loop. This method is possible whenever modulation types are used in which the amplitude does not become zero. This requires an amplifier, which can be controlled within the restricted dynamic range, with a sufficiently linear relationship between the logarithm of the amplification and the control voltage. The control voltage within the second control loop for the controllable amplifier is then negatively proportional to the logarithm of the output amplitude of the transmission amplifier and can be used as actual value in the control loop for the transmission amplifier. Such a circuit further reduces, in particular, the requirements for the envelope detector which is now located behind the controllable amplifier within the control loop. In addition, a signal which is no longer amplitude modulated at all is available as actual signal for a control loop, which may be additionally needed, for the phase-modulated signal.

To generate a transmission signal with high transmission power during the generation of an amplitude-modulated and phase-modulated transmission signal, as is required, for example, in current mobile radio standards, with the best possible linearity of the transmission amplifier, it is generally known to the expert to split the signal to be transmitted in accordance with amplitude and phase and only to apply the signal carrying the phase modulation (i.e., a phase-modulated input signal), to the signal input of the transmission amplifier and to impress the amplitude modulation signal onto the phase-modulated input signal via the transmission amplifier via at least one further input; for example, the input for the supply voltage or an input for the transistor bias voltage. Attention is paid to the fact that the phase-modulated input signal and the amplitude modulation signal are applied matching one another in time in such a manner that the original signal shape is produced again. This method is currently used for amplifying amplitude-modulated and phase-modulated signals which already have been combined. From the amplitude-and phase-modulated signal, the envelope curve, or the amplitude information, is first removed and the signals are applied separately and as described to the transmission amplifier so that the total signal is restored there. The method is, therefore, also generally called "Envelope Elimination and Restoration" (EER). The method has the advantage that the phase-modulated input signal has a constant amplitude and the efficiency of the transmission amplifier can be optimized accurately to this amplitude and can be operated, for example, in saturation. The amplitude modulation signal can be suitably amplified separately so that overall very high efficiency can be achieved. Naturally, this presupposes that the amplitude modulation signal (i.e., the fluctuating supply voltage or bias voltage of the transmission amplifier), in turn, can be generated with good efficiency and good linearity and thus a pure and sufficiently high amplitude modulation signal is present.

If the amplitude information and the phase information are available separately, the phase-modulated input signal and the amplitude modulation signal also can be generated separately. In this case, elimination is no longer necessary but the individual components are processed separately (e.g., controlled or, as in the present case, regulated) and only combined at the transmission amplifier. In the exemplary embodiments given here, it is assumed that such a circuit is used. Nevertheless, the present invention is not restricted to this special type of signal generation.

Incidentally, phase modulation is intended to be understood as the generic term for phase and frequency modulation. The term "phase" is representative of the quantities "phase" or "instantaneous frequency"; i.e., the derivation of the phase with time.

In such a method, in which the amplitude modulation signal is modulated onto an input signal via the supply voltage input or a bias voltage input of the transmission amplifier, the output voltage of the transmission amplifier can be a non-linear function of the supply voltage; i.e., of the current amplitude of the amplitude modulation signal. "Non-linear function" refers to such a relationship within this document. To this end, reference is made to the attached FIG. 4 which shows the amplitude of the output voltage in volts (recalculated to a termination of 50 ohms) as a function of the supply voltage of the output stage in volts. This is a three-stage 6-volt transmission output stage for a radio frequency signal of 900 MHz. As shown in this diagram, the non-linear function has a different slope at each point. The consequence is that the transfer function of the entire control loop which includes the transmission output stage has a different characteristic for each output voltage.

Figure 4:
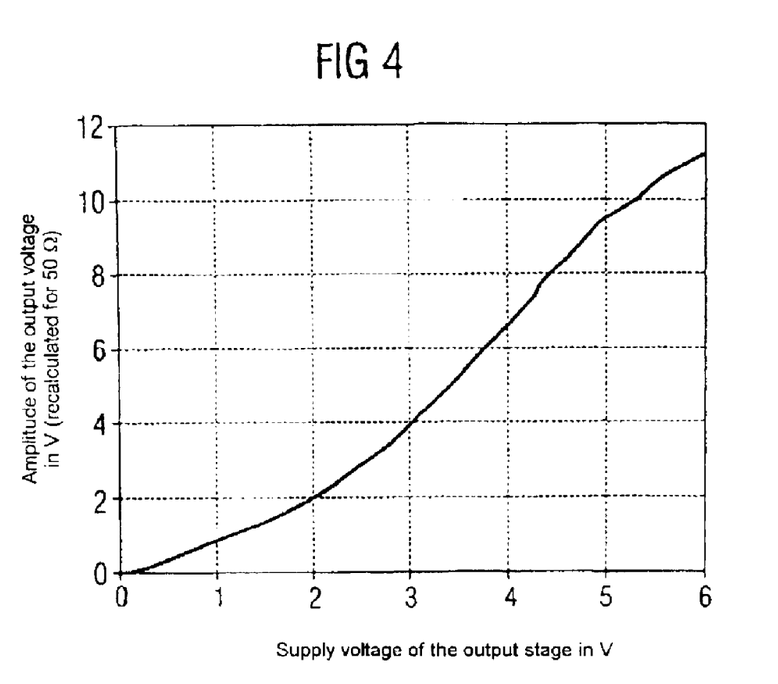
FIG. 4 shows a representation of the radio frequency output voltage (recalculated for 50 ohms) as a function of the supply voltage in a three-stage six-volt transmission output stage, operated in saturation, in the 900 MHz band.

In consequence, because of the non-linear characteristic, the differential gain in the amplitude path, and thus also the stability and the frequency response and the group delay, depend on the instantaneous amplitude. To equalize the different differential gain as shown in FIG. 4 in the forward branch of the regulation of the amplitude path, it is useful to adapt the gain to the amplitude, preferably in the forward branch. However, such a correction amplification which, in each case, fits the current instantaneous value of the amplitude modulation is not easy to achieve.

If, thus, the slope in the amplitude range covered by the amplitude modulation in the required transmission output stage does not change too much, a compromise value, such as the slope at the point of the mean transmission power, can be selected for the correction amplification in the forward branch.

In a particularly preferred exemplary embodiment, therefore, a non-linear function of the control loop for the amplitude modulation signal, such as due to the non-linearity of the output stage, is in each case linearized in an area around a mean transmission power set. That is to say, linearization or adaptation is only performed area by area or step by step, respectively. The linearization is effected in such a manner that the local slope (i.e., the slope of the tangent at this non-linear function), is determined, for example, at a point of the required mean transmission power and the overall gain is correspondingly adjusted via suitable additional amplifiers and/or regulators, in such a manner that an overall gain corresponding to this slope is achieved within the control loop. In consequence, the non-linearity of the function of the control loop is compensated for section by section in this manner. If the amplitude does not fluctuate too much around the mean transmission power, this is a relatively good approximation.

Thus, a sufficiently pure transmission signal is achieved with a given transmission power level. When the transmission power level changes, this correction amplification is preferably adapted. As an alternative, the slope at an instantaneous amplitude or the slope at the location of a mean value of the amplitude also can be used instead of the slope at the point of the required mean transmission power, and the temporal determination can be made over a relatively short or long time. The period of the determination also can depend on how long the amplitude stays in an area in which the non-linear function of the control loop or of the transmission amplifier can be linearized with sufficient accuracy for the output signal.

The amplitude considered can be the nominal amplitude and/or the actual amplitude. Naturally, if the nominal value is in any case output digitally by a logic section, this value is more suitable.

Such a method of linearizing the non-linear function of the control loop area by area or section by section meets in a simple manner the requirements for the stability, frequency response and group delay of the closed control loop for, in each case, one mean transmission power set. That is to say, correction amplification does not need to be carried out in the rhythm of the amplitude modulation in the case of a moderate modulation index and moderate linearity. This method also can, therefore, be used generally in other control loops for amplitude modulation, independently of the concept of attenuation of the feedback signal according to the present invention. It is, therefore, an independent inventive concept.

Apart from using the aforementioned change in correction amplification in the amplitude modulation signal, the linearization also can be effected generally via setting parameters of an amplifier and/or in the control loop of the amplitude modulation signal; for example, as a function of the mean transmission power set. The parameters can be the gain, but also, e.g., a frequency characteristic. It only requires suitable parts or components, such as an amplifier or a controller with parameters which can be adjusted correspondingly.

A so-called PID-type controller is preferably used. A PID-type controller has three components connected in parallel; namely, a proportional component for its stability, an integrating component to prevent a static control error, and a differentiating component to achieve high speed. Such a combination already has been successful for controlling correction in the amplitude branch. When a PID-type controller is used, the gain adaptation in the forward branch also can be different for each of the three components; i.e., a suitable frequency characteristic is set precisely with the three control branches of the PID-type controller as a function of the transmission power level set.

In principle, these components for correction can be arranged at any point in the control loop. However, if the method according to the present invention is used such that the transmission power level is adjusted by adjustable attenuation and/or amplification in the feedback signal, so that the nominal signal is independent of the transmission power level, an adjustment of the correction amplification or of the correction parameters between the comparator and the output stage is appropriate in order to scale the signals in the forward branch in accordance with the transmission output stage. Correction amplification in the forward branch has the advantage that the loop gain is kept constant. If the attenuation in the feedback is thus increased, such as by 1 dB, the gain in the forward branch should be higher by 1 dB with a linear characteristic.

The regulation preferably uses a logarithmic scale. That is to say, the actual value and the nominal value in the control loop are compared in a logarithmic scale. The requirements for the dynamic range in the amplitude feedback branch are lowered further when changing to the logarithmic scale. A logarithmic amplifier can be used for changing to the logarithmic scale; i.e., for converting a signal into a logarithmic signal. In addition, envelope detectors are already available commercially which, at the same time, convert the amplitude to a logarithmic scale and provide a limited signal which would be suitable for a phase feedback loop.

Since multiplication in the linear scale corresponds to addition in the logarithmic scale, the logarithmic measurement value or the result of the comparison in the logarithmic scale, respectively, can be set off against the transmission power level set by adding a constant within the control loop. More elaborate multiplication is then not required.

It must be taken into consideration, however, that the difference between the logarithm of the actual value ln(x+Δx) and the logarithm of the nominal value ln(x) has the correct sign but is not proportional to the control error Δx. If approximate proportionality is to apply to small Δx, the difference can be multiplied by the nominal value x. The following then holds true:

$$x[ln(x+\Delta x)-ln(x)] \approx x[(ln(x)+\Delta x \cdot 1/x) \sim ln(x)] = \Delta x$$

Depending on the modulation index, it is also possible in a logarithmic control arrangement to correct the amplification in the forward branch of the control loop on the basis of a type of mean value of x, for example of the value of the required transmission power level, instead of on the basis of the instantaneous value x of the value of the amplitude.

If the regulation of the amplitude is combined with control of the amplitude, for example the supply voltage of the transmission amplifier is composed of a controlled component and of a regulated component, and if, in the case of regulation, the mean transmission power is adjusted by variable attenuation in the feedback, it may be required, depending on the design of the control, to scale the control signal in accordance with the mean transmission power. This object is achieved, for example, in that the samples for the amplitude which only contain information about the modulation but not about the power output stage, are multiplied by a value corresponding to the transmission output stage in the control.

If the transmission signal is split into a signal with the amplitude information and a signal with the phase information, these part-signals must be combined again synchronized in time so that the original signal is obtained. Separate processing of the part-signals generally results in a different transfer function with a different group delay for each of the part-signals. In a control loop with fluctuating loop gain, a different group delay is generally obtained depending on the loop gain. If the loop gain of the amplitude control loop is a function of the transmission output stage and thus the group delay of the amplitude information depends on the transmission output stage, parts for equalizing the fluctuations in the group delay are provided in a preferred solution. The result is that the amplitude information and the phase information match one another in time when they are combined. Digital equalization of group delay differences is particularly advantageous in which, if necessary, a suitable time offset of the part-signals is already set in the digital section, in dependence on the transmission output stage.

In the text which follows, the present invention will be explained in greater detail via exemplary embodiments and referring to the attached drawings. It is expressly pointed out that the individual features can be essential to the present invention not only in the combinations described but also individually or in other combinations. In particular, all features only described with respect to the method also can be essential to the present invention with respect to a corresponding circuit, and vice versa. In the figures, similar components used in the various exemplary embodiments are designated by the same reference numbers.

DETAILED DESCRIPTION OF THE INVENTION

Figure 1:
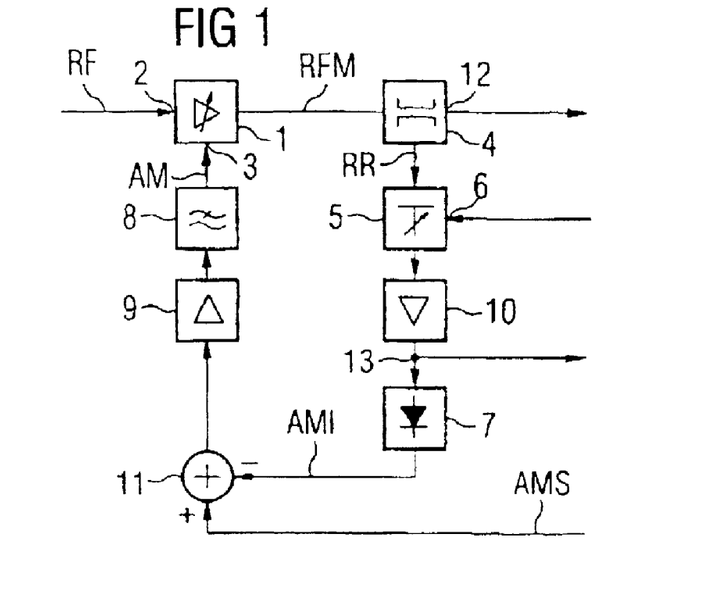
FIG. 1 shows a block diagram for an amplitude modulation signal control loop according to the present invention, according to a first exemplary embodiment.

The exemplary embodiment according to FIG. 1 is a control loop, configured according to the present invention, within a transmission circuit for generating an amplitude-modulated and phase-modulated transmission signal. In this arrangement, a purely phase-modulated input signal RF is applied to a signal input 2 of a transmission amplifier 1. In principle, however, it also can be an unmodulated input signal. An amplitude-modulated signal is applied to a second input 3 of the transmission amplifier 1. This second input 3 is the supply voltage input, that is to say the amplitude is modulated onto the phase-modulated signal RF via the supply voltage so that the required amplitude-modulated and phase-modulated transmission signal RFM is present at the output of the transmission amplifier 1.

The transmission signal RFM is first conducted to a directional coupler 4 and forwarded from there to an antenna via an output 12. The directional coupler couples out a part of the transmission signal RFM as feedback signal RR. The directional coupler essentially only detects the wave passing from the transmission amplifier 1 to the antenna and the components which may be reflected back from the antenna are severely suppressed. The feedback signal RR contains the actual values of the current amplitude and of the current phase and therefore can be used in a control loop for regulating both the phase-modulated input signal and the amplitude-modulated input signal.

As shown in FIG. 1, for this purpose, the feedback signal RR is first attenuated to a particular value in an adjustable attenuator 5. This attenuator 5 can be controlled via the input 6. The signal RR is also amplified by a predetermined value in an amplifier 10, which is optional, and is then supplied to an envelope detector 7 which extracts the amplitude information from the feedback component RR of the transmission signal RFM.

In front of this envelope detector 7, the signal RR is removed at a tap 13 in order to be used as actual value for regulating the phase-modulated signal in a phase-locked loop. Behind the envelope detector 7, the actual value AMI of the current amplitude of the amplitude-modulated signal is present which is compared with the nominal signal AMS for the amplitude modulation in a comparator 11, in this case a subtraction element 11. The difference between this nominal value AMS and the actual value AMI is amplified in a control amplifier 9 and then conducted via a filter 8, determining the control characteristic, and is then available as amplitude modulation signal AM; i.e., as correcting variable for the supply voltage input 3 of the transmission amplifier 1.

The chain of directional coupler 4, adjustable attenuator 5 and amplifier 10 is dimensioned in such a manner that the overall attenuation of the feedback signal component RR compared with the transmission signal RFM exactly corresponds to a required mean transmission power. That is to say, the signal RR in the feedback is attenuated (or amplified, if the attenuation by the directional coupler 4 is too high) in accordance with the required transmission power even before it passes through the envelope detector 7.

Overall, the modulation-related amplitude modulation with a constant mean power remains behind the attenuator 5.

Instead of the configuration shown of directional coupler 4, subsequent attenuator 5 and subsequent amplifier 10, any other arrangement and combination of attenuation and/or amplifying elements is also possible. Arranging the adjustable attenuator 5 in front of the constant amplifier 10 has the advantage that an input signal with constant amplitude is present at the amplifier 10 and the amplifier 10 can thus be optimized to this input voltage with respect to its linearity.

The mean transmission power can be set via the adjustable attenuator. If a higher/lower mean transmission power is required, higher/lower attenuation is correspondingly set via the input 6 via a transmission level control arrangement (not shown). As a result, the transmission power level is automatically increased/reduced within the control loop until nominal and actual signal are matched again at the comparator 11.

The advantage of setting the mean transmission power via adjustable attenuation in the feedback signal in this way consists in that considerably lower requirements for the dynamic range exist for all components following the adjustable attenuation in the control loop, particularly for the envelope detector 7 and the comparator 11. Moreover, the nominal signal AMS for the amplitude also does not need to be present in its total dynamic range. That is to say, during the comparison between nominal and actual values, no nominal values dependent on the transmission power level are needed. In the case of modulation in the EDGE standard, for example, attenuation by 37 dB can be effected for a mean transmission power of 27 dBm (=0.5 W) and by 10 dB for a required mean transmission power of 0 dBm (=1 mW). This reduces the dynamic range from the otherwise total of 44 dB to the 17 dB predetermined by the amplitude modulation for all circuit sections following the attenuation within the feedback branch.

Since the tap 13 for feeding back the signal for the phase-locked loop is also located behind the attenuators 4, 5, 10, the requirements for the assemblies such as mixer, limiter and phase detector are also reduced within such a loop.

Figure 2:
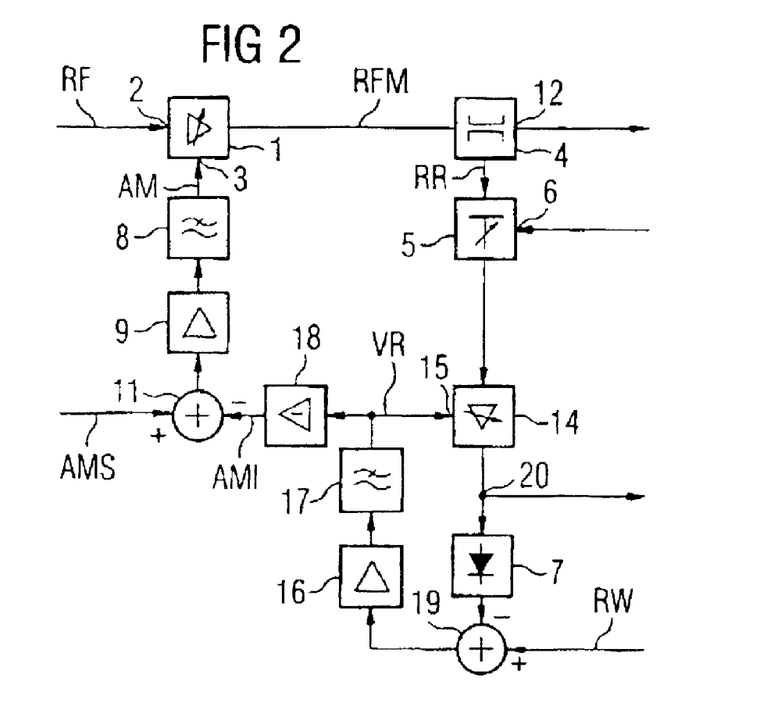
FIG. 2 shows a block diagram for an amplitude modulation signal control loop according to the present invention, according to a second exemplary embodiment.

FIG. 2 shows another advantageous exemplary embodiment for those types of modulation in which the amplitude does not become zero. This example exhibits an additional control loop which is formed by a controllable amplifier 14 which has a linear control characteristic within the restricted dynamic range, a phase detector 7, a comparator 19 and a subsequent control amplifier 16 followed by a low-pass filter 17.

Within this control loop (7, 14, 15, 16, 17, 19), the amplitude-modulated and phase-modulated feedback signal RR is regulated to a constant voltage value. This constant voltage value is predetermined by a reference value RW present as nominal value at the comparator 19. The actual value is determined via the envelope detector 7 at the output of the controllable amplifier 14 and also supplied to the comparator 19. The difference is amplified by the control amplifier 16 and conducted through the subsequent filter 17 (e.g., integrator). The signal VR present at the output of the filter 17 is the control voltage which is applied to the control voltage input 15 of the controllable amplifier 14. This control voltage VR is negatively proportional to the logarithm of the amplitude of the feedback component RR of the transmission signal RFM and, in consequence, can be used as actual value within the control loop for the transmission amplifier 1. It is, therefore, also supplied as actual value AMI via an inverter 18 to a comparator 11 where the difference to the nominal value AMS is determined.

Due to this additional control loop with the controllable amplifier 14, the requirements for the envelope detector 7 are reduced even further since the latter only needs to detect the deviations from the constant voltage value. Moreover, a signal which is no longer amplitude modulated at all but contains the pure phase information is available for a phase-locked loop at the output 20.

Figure 3:
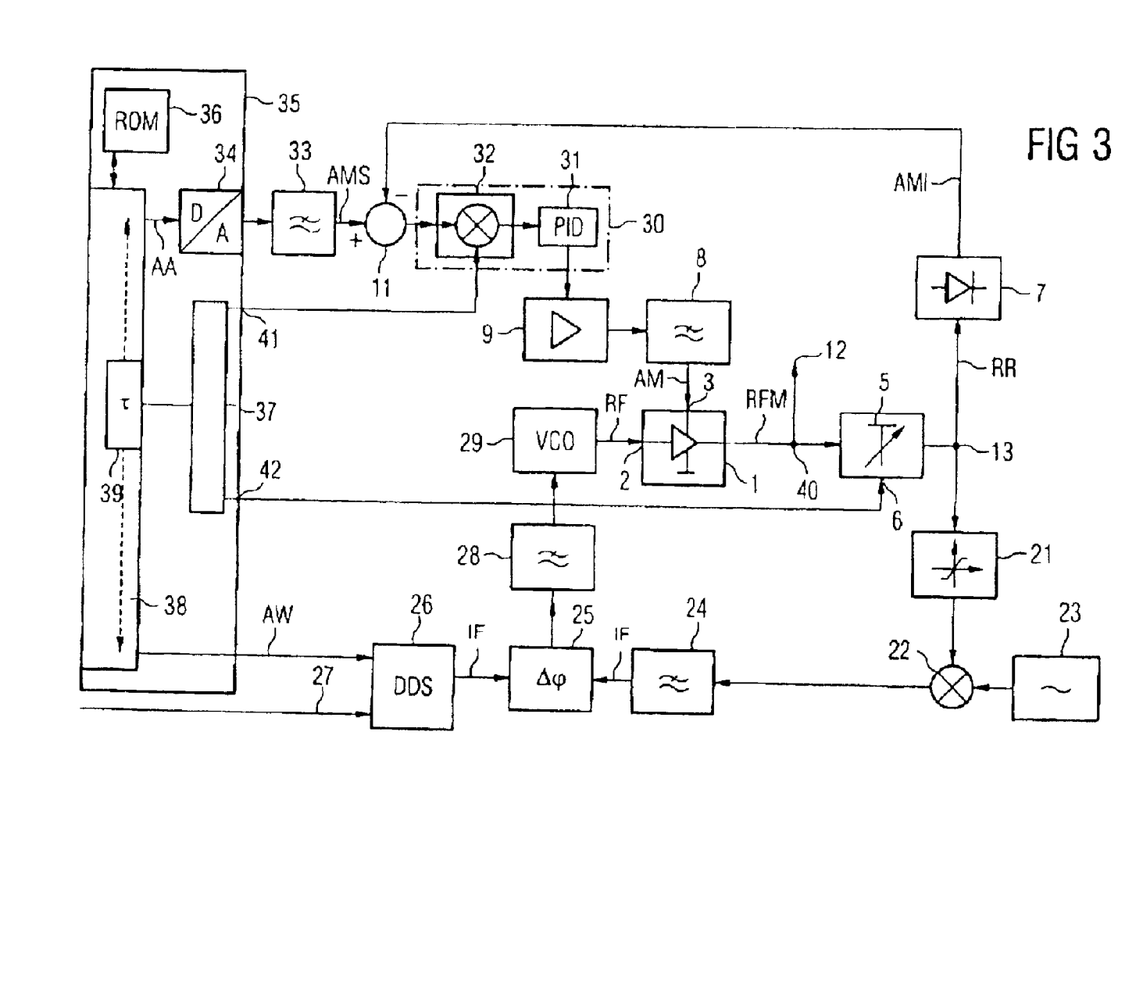
FIG. 3 shows a block diagram for a transmission circuit according to the present invention.

FIG. 3 shows an exemplary embodiment of a transmission circuit which utilizes the method according to the present invention within a control loop for the amplitude modulation signal. This circuit firstly exhibits a digital section 35 which is shown here as a block. However, this digital section 35 also can be a number of sections suitably interconnected. In particular, this digital section 35 also may contain a digital signal processor (DSP) commonly used in mobile radio, which converts the information to be transmitted, that is to say the voice or other data, into the digital coded values.

In this digital section of the transmission circuit, the transmission characteristics for each possible symbol sequence which must be transmitted are already stored, split into digital values, in amplitude and instantaneous frequency variations, in a ROM 36. In dependence on the symbol to be output in each case and also on the preceding and subsequent symbols if intersymbol interference is present, a characteristic curve consisting of samples for a symbol period is selected from this ROM (36). Each characteristic transmission curve is stored in the form of some samples AA for the amplitude and some samples AW for the deviation of the instantaneous frequency from the carrier frequency. In each case, one sample AA for the amplitude and one sample AW for the instantaneous frequency together form a pair. These sample pairs AA, AW are output to the circuit sections for adjusting the amplitude and for adjusting the instantaneous frequency during the period of a symbol to be transmitted.

The frequency-modulated signal is generated via a frequency synthesizer, in this case a direct digital synthesizer (DDS) 26 which, on the one hand, is provided with a center frequency via the input 27 (i.e., the carrier frequency of the signal), and, on the other hand, with a sample AW from the digital section 35 for the deviation of the instantaneous frequency from the carrier frequency. This DDS 26 generates a frequency-modulated oscillation IF in an intermediate frequency. The frequency-modulated signal IF is supplied to a phase comparator 25 which, together with a loop filter 28, a voltage controlled oscillator (VCO) 29, a local oscillator 23, a mixer 22 and a low-pass filter 24, forms a phase-locked loop, in this case a so-called offset PLL.

To compensate for a variable phase rotation of the transmission amplifier 1 arranged behind the VCO 29 due to the AM/PM conversion, it is not the input signal of the transmission amplifier 1 but the output signal which is regulated.

At the output of the transmission amplifier 1, the signal to be fed back, which is predominantly conducted to an antenna at the tap 40 via the output 12, has a greatly fluctuating amplitude. This has disadvantages for the feedback.

On the one hand, it requires a wide dynamic range from the mixer 22 of the offset PLL and from the phase comparator 25. On the other hand, modulation-dependent phase rotations are obtained which, in turn, would cause unwanted AM/PM conversion. This is why the RR part of the transmission signal which is tapped off for the feedback at point 40 is first supplied to a controllable attenuator 5.

In this attenuator 5, the dynamic component which is produced by a transmission level control 37 is eliminated from the feedback signal RR. The outgoing signal of the attenuator 5 is then divided at a branching point 13 and, on the one hand, fed back for regulating an amplitude modulation signal and, on the other hand, supplied to a limiter 21 within the offset PLL. This limiter 21 removes the remaining (modulation-related) amplitude modulation so that the mixer 22 is supplied with a signal with an amplitude which is as constant as possible or, at least, is limited toward the top. The feedback component RR of the transmission signal is converted back to the intermediate frequency via a local oscillator 23 which, as main oscillator, also can supply the clock frequency for the DDS 26. In the low-pass or band-pass filter 24, unwanted frequency conversion products are then removed and a signal is compared with the reference oscillation from the DDS 26 in the phase comparator 25.

An output unit 38 which selects the samples AA, AW from the ROM 36 outputs the sample AA of the amplitude, belonging to the sample AW for the phase, via a digital/analog converter 34. The output is offset in time with respect to one another in such a manner that the values are combined again matching one another in time at the transmission amplifier 1. This time offset can be produced via a control unit 39 which is connected to the transmission level control 37 in dependence on the transmission level or even on the modulation of the transmission amplifier 1.

The nominal amplitude values output at the digital/analog converter 34 are smoothed in a low-pass filter 33. The output value only contains the modulation-related dynamic range, the transmission power level is set separately via a further output 42 of the digital section 35 and the input 6 of the attenuator 5. In the present exemplary embodiment, the attenuation is effected step by step; i.e., the attenuator 5 is simply set from one attenuation step to another discrete attenuation step. Within the amplitude control loop, this automatically leads to a corresponding adjustment of the total transmission power at the output of the transmission amplifier 1 as has been explained in greater detail in the exemplary embodiment according to FIG. 1. The nominal amplitude signal AMS present at the output of the low-pass filter 33 is compared with an actual amplitude signal AMI which is obtained from the feedback signal component RR of the transmission signal RFM via an envelope detector 7 connected to the tap 13. The comparison is made in a comparator 11.

The difference signal is supplied to a control unit 30 which, in this case, consists of a PID-type controller 31 preceded by a multiplier section 32. In the multiplier section 32, the difference signal coming from the comparator 11 is multiplied by a constant dependent on the transmission power level. This value is also output by the transmission level control 37 via an output 41 of the digital section 35. This multiplication compensates for the modulation-dependent different differential loop gains in the control loop, which originate from the non-linear characteristic of the transmission amplifier 1 and from the attenuation in the feedback which depends on the transmission power level, in such a manner that the closed control loop, on the one hand, always remains stable and, on the other hand, the bandwidth of its transfer function does not become too narrow. Furthermore, this reduces the fluctuations in the group delay of the closed control loop.

A PID-type controller 31 arranged within the control unit 30 also provides for stability and rapidity in the control and prevents remaining control errors. The PID-type controller is followed by a Class S amplifier 9 (i.e., a switched-mode amplifier) which, with high efficiency, converts the signal into a pulse-width-modulated oscillation, the switching frequency and interference lines of which are suppressed in a subsequent low-pass filter 8.

The transmission amplifier 1 is driven into saturation at its input (i.e., with respect to the phase-modulated signal input RF), and its amplitude is only modulated via the supply voltage at the input 3 via the amplitude modulation signal AM.

If a higher mean transmission power is required, the transmission level control 37 sets higher attenuation at the attenuator 5. At the same time, the loop gain is increased in the amplitude control arrangement. The control loop then increases the transmission power until the envelope curve of the component RR, which is now attenuated more, of the transmission signal RFM again reaches the nominal value at the comparator 11. If, in contrast, a weaker transmission power level is to be set, the attenuation of the adjustable attenuator 5 and the loop gain in the amplitude control arrangement are reduced. At the comparator 11, an actual amplitude is obtained which is too high until the control loop has lowered the transmission power level. At the same time, the transmission level control 37 corrects the values at the multiplier section 32 in order to achieve linearization of the amplitude control loop in the area of the new transmission power level and the time offset is adjusted in the output of the samples AA, AW for the amplitude and for the phase.

The variable attenuation according to the present invention saves considerable expenditure for linearizing detector characteristics or for the other processing over a very large range of signal amplitudes. It also has the advantage that only one family of nominal values needs to be calculated and stored for the amplitude modulation for only one mean power, and no scaling in a large area is necessary.

Although the present invention has been described with reference to specific embodiments, those of skill in the art will recognize that changes may be made thereto without departing from the spirit and scope of the present invention as set forth in the hereafter appended claims.

What is claimed is:

1. A method for generating an amplitude-modulated transmission signal with an adjustable mean transmission power, the method comprising the steps of:

applying an amplitude modulation signal to an input of a transmission amplifier; and regulating the amplitude modulation signal by using a feedback component of the transmission signal, wherein the feedback component of the transmission signal is used for the regulation attenuated in accordance with a required mean transmission power, and wherein the feedback signal, attenuated in accordance with the mean transmission power, is supplied to a controllable amplifier which regulates the amplitude of the feedback signal to a fixed value.

2. A method for generating an amplitude-modulated transmission signal as claimed in claim 1, wherein the required attenuation is adjusted via a variable attenuator.

3. A method for generating an amplitude-modulated transmission signal as claimed in claim 1, wherein the required attenuation is adjusted via a combination of attenuating and amplifying components, of which at least one is adjustable.

4. A method for generating an amplitude-modulated transmission signal as claimed in claim 1, wherein the attenuation is adjusted step by step.

5. A method for generating an amplitude-modulated transmission signal as claimed in claim 1, wherein the mean transmission power is finely adjusted via the amplitude modulation signal.

6. A method for generating an amplitude-modulated transmission signal as claimed in claim 5, wherein the fine adjustment is effected via scaling samples for the amplitude.

7. A method for generating an amplitude-modulated transmission signal as claimed in claim 1, wherein the attenuation is regulated.

8. A method for generating an amplitude-modulated transmission signal as claimed in claim 1, the method further comprising the step of applying a phase-modulated input signal to a first input of the transmission amplifier, with the amplitude modulation signal being applied to a second input of the transmission amplifier, wherein the amplitude is modulated onto the phase-modulated input signal for generating an amplitude-modulated and phase-modulated transmission signal in the transmission amplifier.

9. A method for generating an amplitude-modulated transmission signal as claimed in claim 1, wherein attenuation according to the required transmission power of the feedback signal occurs before determination of a measure of the instantaneous amplitude from the feedback signal and/or in front of a tap for a feedback of a component of the transmission signal, containing phase information, for regulating the phase-modulated input signal.

10. A method for generating an amplitude-modulated transmission signal as claimed in claim 1, wherein the determination of a measure of the amplitude occurs via an envelope detector.

11. A method for generating an amplitude-modulated transmission signal as claimed in claim 1, wherein a control voltage of the controllable amplifier is used for determining an actual value in the regulation for the amplitude modulation signal for the transmission amplifier and/or the signal fed back to the fixed value is used for regulating the phase-modulated input signal for the transmission amplifier.

12. A method for generating an amplitude-modulated transmission signal as claimed in claim 1, wherein the feedback component of the transmission signal is coupled out via a directional coupler.

13. A method for generating an amplitude-modulated transmission signal as claimed in claim 1, wherein a non-linear function of the control loop for the amplitude modulation signal is respectively linearized in an area around a mean or instantaneous transmission power.

14. A method for generating an amplitude-modulated transmission signal as claimed in claim 13, wherein the area-by-area linearization takes place by setting parameters of an amplifier and/or controller in the control loop of the amplitude modulation signal as a function of the mean transmission power set.

15. A method for generating an amplitude-modulated transmission signal as claimed in claim 14, wherein the parameters include a gain and/or a frequency characteristic.

16. A method for generating an amplitude-modulated transmission signal as claimed in claim 14, wherein the comparison of an actual value and of a nominal value is performed in a logarithmic scale in the control loop of the amplitude modulation signal.

17. A method for generating an amplitude-modulated transmission signal as claimed in claim 14, wherein a difference value between actual and nominal value is multiplied by a value derived from the nominal transmission power or the mean nominal transmission power for driving the transmission amplifier.

18. A transmission circuit for generating an amplitude-modulated transmission signal as claimed in claim 17, further comprising a directional coupler for coupling out the component of the transmission signal for the regulation.

19. A transmission circuit for generating an amplitude-modulated transmission signal with adjustable mean transmission power, comprising:
   a transmission amplifier;
   parts for generating an amplitude modulation signal which are configured such that the amplitude modulation signal is present at an input of the transmission amplifier;
   a control loop for regulating the amplitude modulation signal with parts for feeding back a component of the amplitude-modulated transmission signal for the regulation, wherein the control loop includes parts for attenuating the feedback component of the transmission signal in accordance with a required mean transmission power; and
   a second control loop with a controllable amplifier which regulates the attenuated signal fed back to a fixed value.

20. A transmission circuit for generating an amplitude-modulated transmission signal as claimed in claim 19, wherein the parts for attenuating include a variable attenuator or a combination of attenuating and amplifying components, at least one of which is adjustable.

21. A transmission circuit for generating an amplitude-modulated transmission signal as claimed in claim 19, further comprising an output coupling element with variable attenuation for coupling a component out of the transmission signal.

22. A transmission circuit for generating an amplitude-modulated transmission signal as claimed in claim 20, wherein the attenuator or the adjustable component or the output coupling element exhibits a number of adjustment steps.

23. A transmission circuit for generating an amplitude-modulated transmission signal as claimed in claim 19, further comprising an attenuation control loop for regulating the attenuation of the feedback signal.

24. A transmission circuit for generating an amplitude-modulated transmission signal as claimed in claim 19, wherein a phase-modulated input signal is present at a first input of the transmission amplifier and the amplitude modulation signal is present at a second input of the transmission amplifier so that the amplitude is modulated onto the phase-modulated input signal for generating an amplitude-modulated and phase-modulated transmission signal in the transmission amplifier.

25. A transmission circuit for generating an amplitude-modulated transmission signal as claimed in claim 19, further comprising an envelope detector for determining the amplitude of the signal fed back.

26. A transmission circuit for generating an amplitude-modulated transmission signal as claimed in claim 19, further comprising parts for linearizing a non-linear function of the control loop for the amplitude modulation signal, in each case, within an area around a mean or instantaneous transmission power.

27. A transmission circuit for generating an amplitude-modulated transmission signal as claimed in claim 26, wherein the parts for linearizing include an amplifier and/or controller with adjustable parameters.

28. A transmission circuit for generating an amplitude-modulated transmission signal as claimed in claim 27, wherein the parts for linearization include a PID-type controller with adjustable gain and/or frequency characteristics.

29. A transmission circuit for generating an amplitude-modulated transmission signal as claimed in claim 26, wherein the parts for linearizing include the parts for linearization.

30. A transmission circuit for generating an amplitude-modulated transmission signal as claimed in claim 19, further comprising parts for converting an actual value in the control loop of the amplitude modulation signal into a logarithmic scale.

31. A transmission circuit for generating an amplitude-modulated transmission signal as claimed in claim 30, further comprising parts for multiplying a difference value between the logarithmic actual value and a logarithmic nominal value for driving a transmission amplifier with a value derived from the nominal transmission power or the mean nominal transmission power.

32. A transmission circuit for generating an amplitude-modulated transmission signal as claimed in claim 19 wherein the transmission circuit is incorporated into a communication terminal.

33. A method for generating an amplitude-modulated transmission signal with an adjustable mean transmission power, the method comprising the steps of:
applying an amplitude modulation signal to an input of a transmission amplifier; and
regulating the amplitude modulation signal by using a feedback component of the transmission signal, wherein the feedback component of the transmission signal is used for the regulation attenuated in accordance with a required mean transmission power, wherein a non-linear function of the control loop for the amplitude modulation signal is respectively linearized in an area around a mean or instantaneous transmission power.

34. A method for generating an amplitude-modulated transmission signal as claimed in claim 33, wherein the area-by-area linearization takes place by setting parameters of an amplifier and/or controller in the control loop of the amplitude modulation signal as a function of the mean transmission power set.

35. A method for generating an amplitude-modulated transmission signal as claimed in claim 34, wherein the parameters include a gain and/or a frequency characteristic.

36. A method for generating an amplitude-modulated transmission signal as claimed in claim 34, wherein the comparison of an actual value and of a nominal value is performed in a logarithmic scale in the control loop of the amplitude modulation signal.

37. A method for generating an amplitude-modulated transmission signal as claimed in claim 34, wherein a difference value between actual and nominal value is multiplied by a value derived from the nominal transmission power or the mean nominal transmission power for driving the transmission amplifier.

38. A transmission circuit for generating an amplitude-modulated transmission signal with adjustable mean transmission power, comprising:
a transmission amplifier;
parts for generating an amplitude modulation signal which are configured such that the amplitude modulation signal is present at an input of the transmission amplifier;
a control loop for regulating the amplitude modulation signal with parts for feeding back a component of the amplitude-modulated transmission signal for the regulation, wherein the control loop includes parts for attenuating the feedback component of the transmission signal in accordance with a required mean transmission power; and parts for linearizing a non-linear function of the control loop for the amplitude modulation signal, in each case, within an area around a mean or instantaneous transmission power.

39. A transmission circuit for generating an amplitude-modulated transmission signal as claimed in claim 38, wherein the parts for linearizing include an amplifier and/or controller with adjustable parameters.

40. A transmission circuit for generating an amplitude-modulated transmission signal as claimed in claim 39, wherein the parts for linearization include a PID-type controller with adjustable gain and/or frequency characteristics.

41. A transmission circuit for generating an amplitude-modulated transmission signal as claimed in claim 38, wherein the parts for linearizing include the parts for linearization.

42. A method for generating an amplitude modulated transmission signal with an adjustable mean transmission power, comprising:
applying an amplitude modulation signal to an input of a transmission amplifier, wherein the amplitude modulation signal is acquired in a control loop for the amplitude modulation signal by using a feedback component of the transmission signal;
using the feedback component of the transmission signal for the regulation of attenuation in accordance with the required mean transmission power;
establishing a feedback branch from the control loop for the amplitude modulation signal that includes the feedback component of the transmission signal; and
establishing a forward branch in which the amplitude modulation signal to be applied to the transmission amplifier is acquired, wherein a gain and/or a frequency characteristic in the forward branch of the control loop is adapted in dependence on the required mean transmission power.

43. A transmission circuit for generating an amplitude-modulated transmission signal with adjustable mean transmission power, comprising:
a transmission amplifier comprising means for generating an amplitude modulation signal and transmitting the amplitude modulation signal to an input of the transmission amplifier; and
a control loop that regulates the amplitude modulation signal, said control loop including means for feeding back a component of the amplitude-modulated signal for regulation thereof,
wherein the control loop further includes means for attenuating the feedback component of the transmission signal in accordance with a required mean transmission power, and wherein the means for generating an amplitude modulation signal includes generating exhibit means for adapting a gain and/or a frequency characteristic that is dependent on the required mean transmission power.

* * * * *